United States Patent
Barnet

(10) Patent No.: US 11,209,475 B2
(45) Date of Patent: Dec. 28, 2021

(54) TRANSIENT VOLTAGE SUPPRESSOR BIT STIMULATION

(71) Applicant: Hamilton Sundstrand Corporation, Charlotte, NC (US)

(72) Inventor: Robert Annan Barnet, Roscoe, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 176 days.

(21) Appl. No.: 16/533,397

(22) Filed: Aug. 6, 2019

(65) Prior Publication Data

US 2021/0041493 A1    Feb. 11, 2021

(51) Int. Cl.
    *G01R 31/26*      (2020.01)
    *H02H 9/04*      (2006.01)
    *G01R 31/00*      (2006.01)

(52) U.S. Cl.
    CPC ....... *G01R 31/2632* (2013.01); *G01R 31/008* (2013.01); *H02H 9/044* (2013.01)

(58) Field of Classification Search
None
See application file for complete search history.

(56) References Cited

U.S. PATENT DOCUMENTS

| | | | |
|---|---|---|---|
| 3,651,378 A * | 3/1972 | McWilliams | H02H 9/005 361/111 |
| 9,671,453 B2 | 6/2017 | Quigley et al. | |
| 9,711,960 B2 | 7/2017 | Milkie | |
| 10,090,672 B2 | 10/2018 | Dickey | |
| 10,250,033 B2 | 4/2019 | Dickey et al. | |
| 2008/0055797 A1 | 3/2008 | Wardzala | |
| 2019/0061974 A1 | 2/2019 | Eberts et al. | |
| 2020/0136370 A1* | 4/2020 | Loder | H02J 3/36 |

FOREIGN PATENT DOCUMENTS

| | | | |
|---|---|---|---|
| EP | 3002844 A1 | 4/2016 | |
| EP | 3089303 A1 | 11/2016 | |

OTHER PUBLICATIONS

Extended European Search Report dated Jul. 3, 2020, issued during the prosecution of European Patent Application Mo. EP 19214591.0.

* cited by examiner

*Primary Examiner* — Jermele M Hollington
(74) *Attorney, Agent, or Firm* — Locke Lord LLP; Daniel J. Fiorello; Gabrielle L. Gelozin

(57) ABSTRACT

A transient voltage suppressor (TVS) can include an input line, a return line, and a plurality of TVS diodes disposed in series between the input line and the return line. The TVS can include a switch assembly operatively connected to the plurality of TVS diodes and configured to bypass at least one of the plurality of TVS diodes to allow a remainder of the plurality of TVS diodes to be tested at a voltage that is lower than if the switch assembly were not employed.

18 Claims, 2 Drawing Sheets

TRANSIENT VOLTAGE SUPPRESSOR BIT STIMULATION

FIELD

This disclosure relates to transient voltage suppressors.

BACKGROUND

At present, there is no method to Built-In Test Stimulate (also referred to as "BIT STIM") an input voltage transient voltage suppressor (TVS). Usually an input voltage TVS is made from several devices connected in series. For example, certain devices can include four TVS diodes in series, and based on the nature of the device, a user cannot test across all of them because the test voltage is too high to test. Accordingly, there has been no way to bit stim the TVS to show that each TVS diode is functioning and that the whole module is operational.

Such conventional methods and systems have generally been considered satisfactory for their intended purpose. However, there is still a need in the art for improved TVS systems. The present disclosure provides a solution for this need.

SUMMARY

A transient voltage suppressor (TVS) can include an input line, a return line, and a plurality of TVS diodes disposed in series between the input line and the return line. The TVS can include a switch assembly operatively connected to the plurality of TVS diodes and configured to bypass at least one of the plurality of TVS diodes to allow a remainder of the plurality of TVS diodes to be tested at a voltage that is lower than if the switch assembly were not employed.

The switch assembly can include one or more switches connected between a first pair of the plurality of TVS diodes and the return line and/or between the first pair and a second pair of TVS diodes via one or more test lines connected at a test point between a respective pair of the plurality of TVS diodes. Any or all of the one or more switches can be a MOSFET, an IGBT, or an NPN transistor. Any suitable number of switches is contemplated herein.

In certain embodiments, the plurality of TVS diodes can include four TVS diodes. Any other suitable amount of diodes are contemplated herein. The one or more switches can include a first switch configured to selectively bypass a first TVS diode and a second switch configured to selectively bypass as second TVS diode.

The one or more test lines can include a first test line connected between the first pair and the first switch. The one or more test lines include a second test line connected between the second pair and the second switch. In certain embodiments, the second switch can be connected in series with the first switch between the second test line and the return line such that the first test line is connected between the first switch and the second switch.

The TVS can include a switching module configured to control each switch. The switching module can be configured to close the first switch and open the second switch to bypass the first TVS diode. The switching module can be configured to open the first switch and close the second switch to bypass the second TVS diode after bypassing the first TVS diode. The switching module can be configured to apply a test voltage less than an operational voltage to the input line and sequence each switch upon receiving a startup signal. Any other suitable functionality for the switching module is contemplated herein.

In accordance with at least one aspect of this disclosure, an aircraft system can include a TVS, e.g., as disclosed above. The system can include a switch assembly operatively connected to the TVS and configured to bypass at least one TVS diode to reduce test voltage to test a remainder of TVS diodes.

In accordance with at least one aspect of this disclosure, a method can include bypassing at least one of a plurality of transient voltage suppressor diodes of a transient voltage suppressor to reduce a test voltage. The method can include any other suitable method and/or portion(s) thereof.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
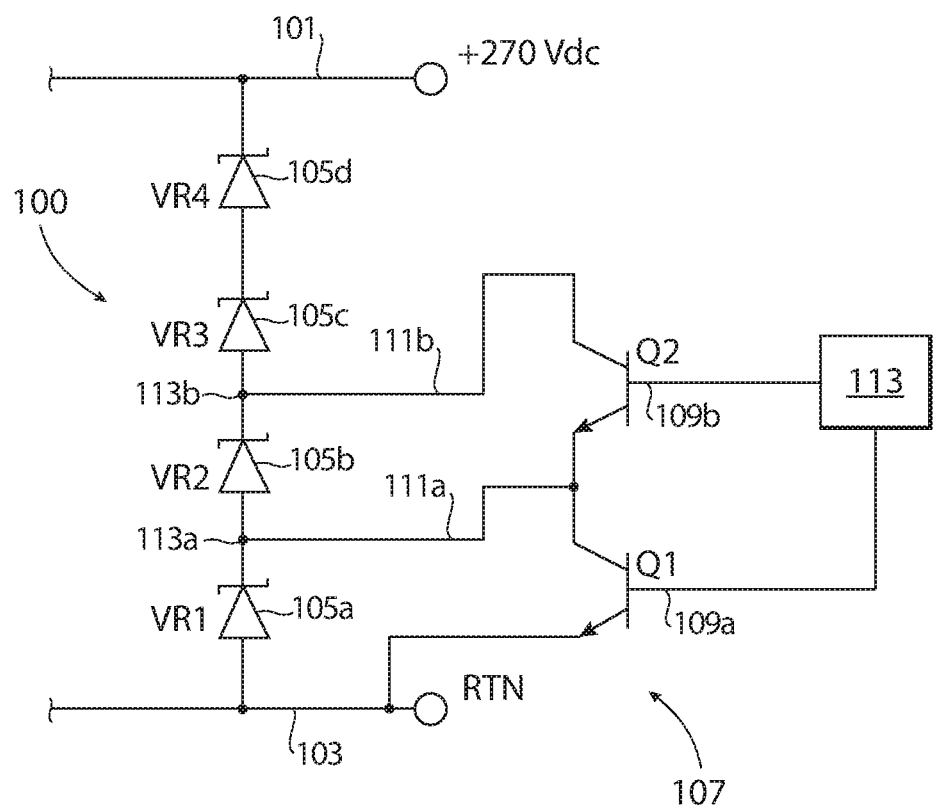
FIG. 1 is a circuit diagram of an embodiment of a transient voltage suppressor (TVS) in accordance with this disclosure.
Figure 2:
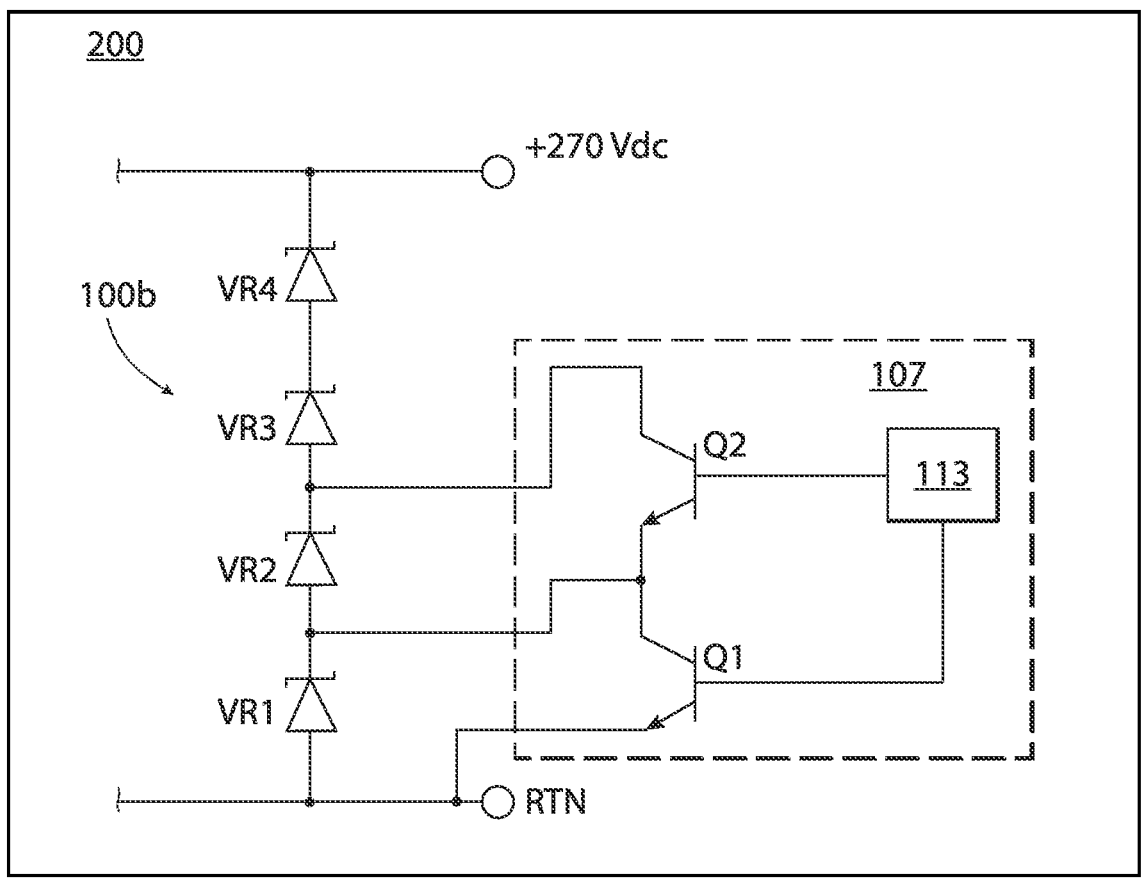
FIG. 2 is a schematic diagram of an embodiment of a system in accordance with this disclosure.

Reference will now be made to the drawings wherein like reference numerals identify similar structural features or aspects of the subject disclosure. For purposes of explanation and illustration, and not limitation, an illustrative view of an embodiment of a transient voltage suppressor (TVS) in accordance with the disclosure is shown in FIG. 1 and is designated generally by reference character 100. One or more other aspects and/or embodiments of this disclosure are shown in FIG. 2.

Referring to FIG. 1, a transient voltage suppressor (TVS) 100 can include an input line 101, a return line 103, and a plurality of TVS diodes 105a, b, c, d disposed in series between the input line 101 and the return line 103. The TVS 100 can include a switch assembly 107 operatively connected to the plurality of TVS diodes 105a, b, c, d and configured to bypass at least one of the plurality of TVS diodes (e.g., 105a and/or 105b as shown) to allow a remainder of the plurality of TVS diodes to be tested at a voltage that is lower than if the switch assembly were not employed (e.g., 105c, 105d, and one of 105a or 105b) (e.g., to reduce test voltage to test a remainder of TVS diodes).

The switch assembly 107 can include one or more switches 109a, 109b connected between a first pair (e.g., 105a and 105b) of the plurality of TVS diodes 105a, b, c, d and the return line 103 and/or between the first pair (e.g., 105a and 105b) and a second pair (e.g., 105b and 105c) of TVS diodes 105a, b, c, d via one or more test lines 111a, 111b connected at a test point 113a, 113b between a respective pair of the plurality of TVS diodes 105a, b, c, d. Any or all of the one or more switches 109a, 109b can be a MOSFET, an IGBT, or an NPN transistor. Any other suitable type of transistor or other switch is contemplated herein.

Any suitable number of switches (e.g., two as shown, the number of diodes minus 1, or any other number) is contemplated herein.

In certain embodiments, the plurality of TVS diodes 105a, b, c, d can include four TVS diodes 105a, b, c, d, e.g., as shown. Any other suitable amount of diodes are contemplated herein. The one or more switches 109a can include a first switch 109a configured to selectively bypass a first TVS diode 105a and a second switch 109b configured to selectively bypass as second TVS diode 105b.

The one or more test lines 111a, 111b can include a first test line 111a connected between the first pair 105a, 105b and the first switch 109a. The one or more test lines 111a, 111b can include a second test line 111b connected between the second pair 105b, 105c and the second switch 109b. In certain embodiments, the second switch 109b can be connected in series with the first switch 109a between the second test line 111b and the return line 103 such that the first test line 111a is connected between the first switch 109a and the second switch 109b, e.g., as shown.

The TVS 100 can include a switching module 113 configured to control each switch 109a, 109b, for example. The switching module 113 can be configured to close the first switch 109a and open the second switch 109b to bypass the first TVS diode 105a. In certain embodiments, the switching module 113 can be configured to open the first switch 109a and close the second switch 109b to bypass the second TVS diode 105b, e.g., after bypassing the first TVS diode 105a. The switching module 113 can be configured to apply a test voltage (e.g., 270V) less than an operational voltage (e.g., 330V) to the input line 101 and sequence each switch 109a, 109b upon receiving a startup signal (e.g., a signal that aircraft avionics are turned on). Any other suitable functionality for the switching module 113 is contemplated herein. The switching module 113 can include any suitable computer hardware and/or software as appreciated by those having ordinary skill in the art.

In the embodiment shown, if the first switch 109a is turned on, TVS diode 105a will be bypassed, and diodes 105b, 105c, and 105b can be measured. If the second switch 109b is turned on, TVS diode 105b will be bypassed, and diodes 105a, 105c, and 105b can be measured. While embodiments show two test pathways, it is contemplated that any suitable number of test pathways can be utilized (e.g., an additional test line between 105c and 105d, and a third switch in series with the other switches 109a, 109b). In a four diode embodiment, e.g., as shown, at least two test pathways may be desired to be able to test all diodes.

While a configuration to bypass a single diode at a time is shown, it is contemplated that the switch assembly 107 can be configured to bypass a plurality of diodes 105a, b, c, d at a time. For example, the switch assembly 107 can be configured to have the first line 111a between diodes 105c, 105b, and the second test line 111b can be in front of TVS diode 105d (between 105d and the input line 101). This can allow two of the diodes 105a and 105b, or diodes 105c and 105b to be bypassed at the same time while testing the other two diodes. Any other suitable arrangement with any suitable number of test lines in any suitable arrangement to bypass any suitable individual or groups of diodes is contemplated herein.

Any suitable voltage TVS 100 can be tested at lower voltage using certain embodiments. For example, if the TVS 100 is a 330V TVS with four diodes in series as shown, each can have a nominal 82.5 volts. If one is shorted out in this scenario, the voltage clamps at 247.5V, lower than the 330V otherwise required to test across all of the diodes.

As disclosed herein, the TVS 100 can be a single module, or can be separate components connected together in any suitable manner. Any suitable components and/or combinations thereof are contemplated herein.

In accordance with at least one aspect of this disclosure, referring to FIG. 2, an aircraft system 200 can include a TVS 100b having a plurality of diodes 105a, b, c, d, e.g., as disclosed above. The TVS 100b can include any suitable portion(s) of the TVS 100 as disclosed above (e.g., all but the switches 109a, 109b and switching module 113).

The system 200 can include a switch assembly 107, e.g., as described above, operatively connected to the TVS 100b and configured to bypass at least one TVS diode 105a, 105b, 105c, 10d to reduce test voltage to test a remainder of TVS diodes. The system 200 can include a switching module 113, e.g., as disclosed above.

In accordance with at least one aspect of this disclosure, a method can include bypassing at least one of a plurality of transient voltage suppressor (TVS) diodes of a transient voltage suppressor (TVS) to allow a remainder of the plurality of transient voltage suppressor diodes to be tested at a voltage less than if the bypassing were not performed. The method can include automatically testing the TVS upon aircraft startup (e.g., booting up of avionics). The method can include any other suitable method and/or portion(s) thereof.

Certain aircraft systems can include a 270V input. A transient voltage suppression diode, also referred to as transorbs, is designed to open very quickly in an over voltage situation. If such diodes fail, failure mode is to short circuit. Embodiments can include a control system (e.g., the switching module) that can be automated and part of the power up sequencing.

Embodiments add selectable pathways (e.g., by having one or more test line wires connected between diodes) to test less than all of the TVS diodes at a time to allow a lower voltage to be dropped across the diodes for test. Embodiments can include one or more transistors that can be turned on or off by command to allow this. Embodiments can be adapted to any desired voltage for any suitable system type. Embodiments can include any other suitable circuit components (e.g., a resistor in series with TVS diodes to test with different voltage than an input voltage).

As appreciated by those having ordinary skill in the art, usually an input voltage transient voltage suppressor is made from several devices connected in series. In accordance with this disclosure, if one or more internal connections are brought out, the connections may be switched so the transient voltage suppressor may be tested at a lower voltage. Embodiments provide improved reliability and better test coverage.

As will be appreciated by those skilled in the art, aspects of the present disclosure may be embodied as a system, method, or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A transient voltage suppressor (TVS), comprising:
an input line;
a return line;
a plurality of TVS diodes disposed in series between the input line and the return line; and
a switch assembly operatively connected to the plurality of TVS diodes and configured to bypass at least one of the plurality of TVS diodes to allow a remainder of the plurality of TVS diodes to be tested at a voltage that is lower than if the switch assembly were not employed, wherein the switch assembly can include one or more switches connected between a first pair of the plurality of TVS diodes and the return line and between the first pair and a second pair of TVS diodes via one or more test lines connected at a test point between a respective pair of the plurality of TVS diodes, such that one pair of diodes can be bypassed at the same time as the remaining pair of diodes is being tested.

2. The TVS of claim 1, wherein any or all of the one or more switches can be a MOSFET, an IGBT, or an NPN transistor.

3. The TVS of claim 1, wherein the plurality of TVS diodes include four TVS diodes.

4. The TVS of claim 1, wherein the one or more switches include a first switch configured to selectively bypass a first TVS diode and a second switch configured to selectively bypass as second TVS diode.

5. The TVS of claim 4, wherein the one or more test lines include a first test line connected between the first pair and the first switch.

6. The TVS of claim 5, wherein the one or more test lines include a second test line connected between the second pair and the second switch.

7. The TVS of claim 6, wherein the second switch is connected in series with the first switch between the second test line and the return line such that the first test line is connected between the first switch and the second switch.

8. The TVS of claim 6, further comprising a switching module configured to control each switch.

9. The TVS of claim 8, wherein the switching module is configured to close the first switch and open the second switch to bypass the first TVS diode.

10. The TVS of claim 9, wherein the switching module is configured to open the first switch and close the second switch to bypass the second TVS diode after bypassing the first TVS diode.

11. The TVS of claim 10, wherein the switching module is configured to apply a test voltage less than an operational voltage to the input line and sequence each switch upon receiving a startup signal.

12. An aircraft system, comprising:
a transient voltage suppressor (TVS), comprising:
an input line;
a return line; and
a plurality of TVS diodes disposed in series between the input line and the return line; and
a switch assembly operatively connected to the series of TVS diodes and configured to bypass at least one TVS diode to reduce test voltage to test a remainder of TVS diodes, wherein the switch assembly can include one or more switches connected between a first pair of the plurality of TVS diodes and the return line and between the first pair and a second pair of TVS diodes via one or more test lines connected at a test point between a respective pair of the plurality of TVS diodes, such that one pair of diodes can be bypassed at the same time as the remaining pair of diodes is being tested.

13. The system of claim 12, wherein the plurality of TVS diodes include four TVS diodes.

14. The system of claim 13, wherein the one or more switches include a first switch configured to selectively bypass a first TVS diode and a second switch configured to selectively bypass as second TVS diode.

15. The system of claim 14, wherein the one or more test lines include a first test line connected between the first pair and the first switch.

16. The system of claim 15, wherein the one or more test lines include a second test line connected between the second pair and the second switch.

17. The system of claim 16, wherein the second switch is connected in series with the first switch between the second test line and the return line such that the first test line is connected between the first switch and the second switch.

18. A method, comprising:
bypassing at least one of a plurality of transient voltage suppressor diodes of a transient voltage suppressor to allow a remainder of the plurality of transient voltage suppressor diodes to be tested at a voltage less than if the bypassing were not performed, wherein bypassing includes bypassing one pair of diodes at the same time as the remaining pair of diodes is being tested.

* * * * *